(12) United States Patent
Toyoda et al.

(10) Patent No.: US 6,806,040 B2
(45) Date of Patent: Oct. 19, 2004

(54) PHOTOSENSITIVE COMPOSITION FOR MANUFACTURING OPTICAL WAVEGUIDE, PRODUCTION METHOD THEREOF AND POLYMER OPTICAL WAVEGUIDE PATTERN FORMATION METHOD USING THE SAME

(75) Inventors: Seiji Toyoda, Tokai-mura (JP); Saburo Imamura, Mito (JP); Satoru Tomaru, Mito (JP); Takashi Kurihara, Mito (JP); Koji Enbutsu, Mito (JP); Shoichi Hayashida, Hitachinaka (JP); Tohru Maruno, Mito (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 82 days.

(21) Appl. No.: 10/262,777

(22) Filed: Oct. 2, 2002

(65) Prior Publication Data

US 2003/0148228 A1 Aug. 7, 2003

Related U.S. Application Data

(62) Division of application No. 09/409,078, filed on Sep. 30, 1999, now Pat. No. 6,537,723.

(30) Foreign Application Priority Data

Oct. 5, 1998 (JP) .......................................... 10-283142

(51) Int. Cl.$^7$ ........................... G03F 7/038; G03F 7/20; G03F 7/30
(52) U.S. Cl. .................... 430/321; 430/325; 430/270.1; 430/280.1; 430/914; 522/148; 522/170; 522/172
(58) Field of Search .......................... 430/270.1, 280.1, 430/914, 321, 325; 522/148, 170, 172

(56) References Cited

U.S. PATENT DOCUMENTS 4,614,675 A 9/1986 Ona et al.

(List continued on next page.)

FOREIGN PATENT DOCUMENTS

JP 3-43423 A 2/1991

(List continued on next page.)

OTHER PUBLICATIONS

James V. Crivello et al.; *Synthesis of Novel Multifunctional Siloxane Oligomers Using Sol–Gel Techniques and Their Photoinitiated Cationic Polymerization*; Chem. Mater.; 1997; pp. 1554–1561, vol. 9, No. 7.

(List continued on next page.)

*Primary Examiner*—Mark F. Huff
*Assistant Examiner*—Sin J. Lee
(74) *Attorney, Agent, or Firm*—Alston & Bird LLP

(57) ABSTRACT

A photosensitive composition for optical waveguides comprising of an organic oligomer, a polymerization initiator and a crosslinking agent, the organic oligomer being a silicone oligomer represented by the following formula (1), wherein X denotes hydrogen, deuterium, halogen, an alkyl group or an alkoxy group; m is an integer from 1 to 5; x and y represent the proportion of respective units, and neither x nor y is 0; and $R_1$ denotes a methyl, ethyl, or isopropyl group; a production method thereof, and a polymer optical waveguide pattern formation method using the same.

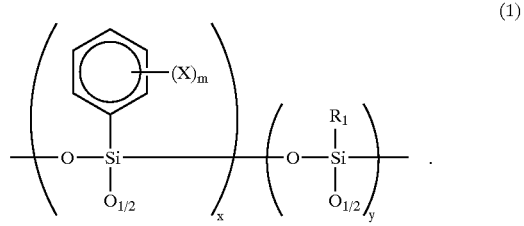

(1)

8 Claims, 1 Drawing Sheet

U.S. PATENT DOCUMENTS 6,096,483 A    8/2000    Harkness et al.

FOREIGN PATENT DOCUMENTS

| | | |
|---|---|---|
| JP | 8-271746 A | 10/1996 |
| JP | 08-327842 A | 12/1996 |
| JP | 9-124793 A | 5/1997 |
| JP | 9-325201 A | 12/1997 |
| JP | 10-036511 A | 2/1998 |
| JP | 10-090544 A | 4/1998 |
| JP | 10-148729 A | 6/1998 |
| JP | 10-253845 A | 9/1998 |

OTHER PUBLICATIONS

Takashi Kurokawa et al.; *Fiber optic sheet formation by selective photopolymerization*; Applied Optics; Feb. 15, 1978; p. 646–650, vol. 17, No. 4.

Imamura et al.; *Polymer Channel Waveguides with Low Loss at 1–3 µm*; Electronics Letters; Jul. 18, 1991; pp. 1342–1343, vol. 27, No. 15.

J.M. Hagerhorst–Trewhella et al.; *Polymeric Optical Waveguides*; Integrated Optics and Optoelectronics; Sep. 1989, pp. 379–386, vol. 1177.

Machine–Assisted English translation for the Japanese document, JP 9–124793 (Hayashida et al.).

PHOTOSENSITIVE COMPOSITION FOR MANUFACTURING OPTICAL WAVEGUIDE, PRODUCTION METHOD THEREOF AND POLYMER OPTICAL WAVEGUIDE PATTERN FORMATION METHOD USING THE SAME

CROSS REFERENCE TO RELATED APPLICATION

The present application is a divisional of U.S. patent application Ser. No. 09/409,078, filed Sep. 30, 1999 now U.S. Pat. No. 6,537,723, the contents of which are incorporated in their entirety herein.

This application is based on Patent Application No. 10-283142 filed on Oct. 5, 1998 in Japan, the content of which is incorporated hereinto by reference.

BACKGROUND OF THE INVENTION

1. Field of the Invention

The present invention relates to a polymer optical waveguide pattern formation method using a polymer material. The present invention can be utilized in various optical waveguides, optical integrated circuits, optical wiring boards and the like which are used in general optical and micro-optical areas and in optical communication or optical information processing areas.

2. Description of the Related Art

Pushed by market requirements and national policy, construction of high-capacity optical fiber networks and preparation of FTTX (fiber to the X point) are being promoted. That is, WDM-MUX/DEMUX (Wavelength Division Multiplexing-Multiplexer/Demultiplexer) using an arrayed waveguide grating (AWG) as a key device has reached a practically applicable level, and a high-capacity and high-expandability network has become available. The demands of the market are expected for changes into optical networks of large-scale nodes, local networks, and various LAN systems in addition to transmission lines and MUX/DEMUX, in the future.

Polymer material is an optically isotropic amorphous material of which optical propagation loss is low as is inorganic glass. Application of polymer material to passive optical circuits is expected to be promising. Further, utilizing its thermo-optic (TO) constant, which is an order of magnitude greater than glass, polymer material has begun to be employed as a waveguide material to fabricate TO switches and the like. Specific waveguide materials can include acrylic polymer, acrylic resin, polyimide, silicone resin, epoxy resin, polycarbonate and the like. Various characteristics are required for waveguide materials. Among them, transparency, heat stability, optical isotropy, and processability are particularly important characteristics.

Most polymer materials are highly transparent in the visible region. On the other hand, overtone of vibration absorption of carbon-hydrogen bond (such as hydrocarbon skeleton) or oxygen-hydrogen bond (such as hydroxy group) causes decrease in transparency in the near infrared region, which is considered as communication wavelength region. Therefore, a fluorocarbonization of the basic skeleton and introduction of siloxane skeleton are being attempted.

A rigid polyimide skeleton, resilient siloxane skeleton, and bridged structure formed by heat or light are being employed to improve heat stability.

A component having optical anisotropy such as aromatic ring should not be oriented in order to improve optical isotropy. However, heat stability and optical isotropy are difficult to realize simultaneously because the rigid or resilient skeleton to improve the heat stability as described above promotes orientation of molecule.

When optical waveguides are fabricated, the processability primarily indicates formability of core-clad layer structure. When a high molecular-weight polymer material is spin-coated from a solution, an intermixing between core and clad layer tends to occur, which is often a problem in waveguide processability. On the other hand, when a low molecular-weight oligomer is spin-coated and then bridged by light or heat, since the bridged polymer film becomes insoluble in a solvent, intermixing can be prevented. As a result, it tends to have a superior processability.

Polymer materials are suitable for producing large-area optical waveguides because they are readily formed into thin films by a spin coating method or a dipping method. Further, according to such a method, since film is not formed at high temperatures, it has an advantage that optical waveguides can be constructed on substrates such as semiconductor substrates or plastic substrates which are difficult to be heat-treated at high temperatures. Still further, it is possible to produce a flexible optical waveguide utilizing the flexibility or tenacity of polymer materials. For such reasons, it is expected to produce optical waveguide parts in large quantity and at low cost by using polymer optical materials: such optical waveguide parts include optical integrated circuits used in the field of optical communications, optical wiring boards used in the field of optical information processing and the like.

Polymer optical materials have been considered to have problems in terms of environmental resistance such as heat stability or moisture resistance. However, a material with heat stability by introducing an aromatic group such as benzene ring and/or an inorganic polymer is disclosed recently, for example, in Japanese Patent Application Laid-open No. 3-43423(1991). Polymer materials have advantageous characteristics in thin film formation and heat treatment process as described above, and problems such as in heat stability or moisture resistance are being improved.

The following methods are reported to form polymer optical waveguides, such as a photo-locking or selective photo-polymerization method (Kurokawa et al., Applied Optics vol. 17, p. 646, 1978) in which a monomer is included in a polymer material, the polymer material is reacted partly with the monomer by irradiation with light to produce a refractive index difference between the irradiated part and unirradiated part; an applied method such as lithography or etching used in semiconductor processing (Imamura et al., Electronics Letters, vol. 27, p. 1342, 1991); and a method using a photosensitive polymer or resist which is sperior in simplicity and mass production adaptability (Trewhella et al., SPIE, vol. 1177, p. 379, 1989). Further, a waveguide production method in which a photopolymerization initiator is added to an epoxy oligomer or the like, and a core is formed by irradiation of light, and then an uncured part is removed, is disclosed in Japanese Patent Application Laid-open No. 10-253845(1998).

As described above, there are many requirements for polymer materials used for optical waveguides. Among them, there are some requirements such as heat stability and optical isotropy. They are based on ideas contrary to each other in the molecular design. Consequently, there is very few material which meets all of such requirements at the same time. However, such a material is not absolutely unavailable, and there is an example of a thermosetting silicone resin: the compatibility between transparency and heat stability can be established by using a ladder siloxane skeleton; optical isotropy can be secured by random thermal crosslinking; and core-clad layer structure formation can be facilitated by thermally crosslinking a film formed with an oligomer and making the film insoluble in solvents.

As described above, silicone resin has superior characteristics as an optical waveguide material, but processability has not been satisfactory. For example, dry etching in the production of a core ridge requires a long time and a plurality of processes, like an inorganic material such as glass or semiconductor. Therefore, as to silicone resin for optical waveguide, as already realized in certain polymers, that is, a photocurable resin, it is desirable that the core-ridge can be directly produced by a simple method in which the resin is photo-crosslinked and an unreacted part is washed out by a solvent.

Normally, as a method for providing a silicone oligomer with a photocurability, a method is used in which epoxy group or vinyl ether group or radical polymerizable acrylic group is introduced into the silicone oligomer itself by covalent bond. However, in these methods, bond between side chains by crosslinking is dominant rather than siloxane bond, which generates problems not only in heat stability but also in an inevitable increase in optical propagation loss due to increase in ratio of hydroxy group in the case of epoxy or due to increase in ratio of hydrocarbon in the case of vinyl ether or acrylics.

SUMMARY OF THE INVENTION

In view of such circumstances relating to a polymer material for an optical waveguide, the present invention relates to a photosensitive composition for producing an optical waveguide and a polymer optical waveguide pattern formation method. The present invention provides an optical waveguide material consisting of a polymer material with a photosensitivity. This invention discloses simple and high-speed waveguide formation with outstanding performance in all of transparency, heat stability, optical isotropy and processability.

When an aromatic group such as benzene ring is contained in a molecular structure in order to improve the heat stability, the aromatic group such as benzene ring is oriented to manifest an optical anisotropy thereby increasing birefringence. Because an optical waveguide or the like produced using such a material has a polarization dependence, its output characteristic is changed by variation of polarization plane even when the intensity of incident light is constant. In particular, this is a problem when the waveguide is actually used as a single mode optical waveguide. To eliminate the polarization dependence, it is necessary to use in combination with a polarizer. However, this method has a disadvantage because it makes the construction of the optical device substantially complicated.

The polymer optical waveguide pattern formation method according to the present invention has been made in view of such present circumstances. The object of the present invention is to form a polymer optical waveguide pattern which is simple and suitable for mass production and can be easily connected with optical components by using a reactive oligomer which has simple pattern formation ability, superior heat stability and moisture resistance, small birefringence, and superior processability.

Therefore, in a first aspect of the present invention, a photosensitive composition for optical waveguides comprises: an organic oligomer, a polymerization initiator and a crosslinking agent, in which the organic oligomer is a silicone oligomer represented by the following formula (1):

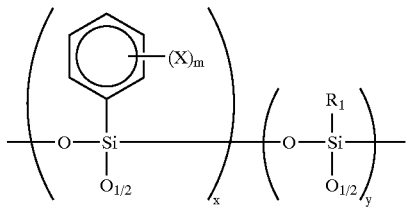

wherein X denotes hydrogen, deuterium, halogen, an alkyl group or an alkoxy group; m is an integer from 1 to 5; x and y designate the proportion of respective units, and neither x nor y is 0; and $R_1$ denotes a methyl, ethyl, or isopropyl group.

Here, the photosensitive composition for optical waveguides may be cationic photopolymerizable, and the crosslinking agent capable of greatly activating the photopolymerizability of the silicone oligomer as a main component of the composition may have at least an epoxy moiety or an alkoxysilane moiety in the molecule.

In a second aspect of the present invention, a photosensitive composition for optical waveguides comprises: an organic oligomer and a polymerization initiator, in which the organic oligomer is a silicone oligomer represented by the following formula (2):

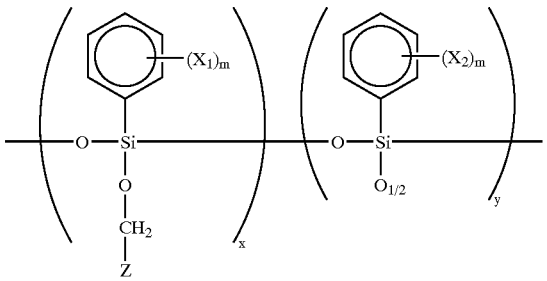

wherein $X_1$ and $X_2$ may be the same as or different from each other, and represent hydrogen, deuterium, halogen, an alkyl group or an alkoxy group; m is an integer from 1 to 5; and Z denotes an epoxy group shown in the following formula (I) or (II):

(I)

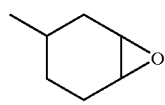

(II)

wherein x and y designate the proportion of respective units; and y is smaller than x and may be 0.

In a third aspect of the present invention, a photosensitive composition for optical waveguides comprises: an organic oligomer, a polymerization initiator and a crosslinking agent, in which the organic oligomer is a silicone oligomer represented by the following formula (3):

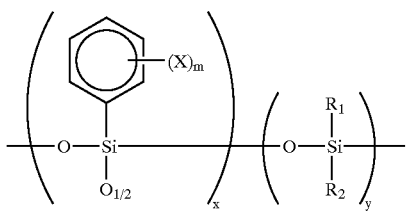

(3)

wherein X denotes hydrogen, deuterium, halogen, an alkyl group or an alkoxy group; m is an integer from 1 to 5; x and y designate the proportion of respective units, and neither x nor y is 0; and $R_1$ and $R_2$ may be the same as or different from each other, and denote a methyl, ethyl, or isopropyl group.

Here, the photosensitive composition for optical waveguides is cationic photopolymerizable, and the crosslinking agent capable of greatly activating the photopolymerizability of said silicone oligomer as a main component of the composition may have at least an epoxy moiety or an alkoxysilane moiety in the molecule.

In a fourth aspect of the present invention, a photosensitive composition for optical waveguides comprises: an organic oligomer and a polymerization initiator, in which the organic oligomer is a silicone oligomer represented by the following formula (4):

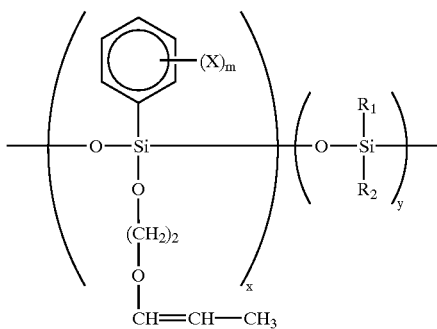

(4)

wherein X denotes hydrogen, deuterium, halogen atom, alkyl or alkoxy group; m is an integer from 1 to 5; x and y designate the proportion of respective units, and neither x nor y is 0; and $R_1$ and $R_2$ may be the same as or different from each other and denote a methyl, ethyl, or isopropyl group.

In a fifth aspect of the present invention, a photosensitive composition for optical waveguides comprises: an organic oligomer and a polymerization initiator, in which the organic oligomer is a oligomer represented by the following formula (5):

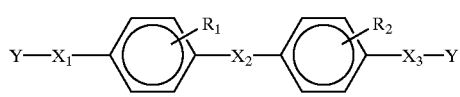

(5)

wherein $R_1$ and $R_2$ may be the same as or different from each other and denote hydrogen, halogen, an alkyl group, an alkoxy group or a trifluoromethyl group; $X_1$, $X_2$ and $X_3$ may be the same as or different from each other, and denote a connection group including at least one selected from the group consisting of an alkylene, alkyleneoxy, oxyalkylene and aromatic group; and Y denotes a polymerization activating group.

In a sixth aspect of the present invention, a photosensitive composition for optical waveguides comprises: an organic oligomer and a polymerization initiator, in which the organic oligomer is a oligomer represented by the following formula (6):

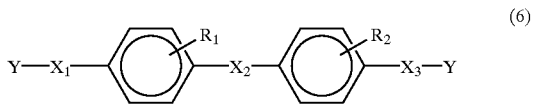

(6)

wherein $R_1$ and $R_2$ may be the same as or different from each other, and denote hydrogen, halogen, an alkyl group, an alkoxy group or a trifluoromethyl group; $X_1$, $X_2$ and $X_3$ maybe the same as or different from each other, and denote a connection group including at least one selected from the group consisting of an alkylene, alkyleneoxy, oxyalkylene and aromatic group and including at least one OH group; and Y denotes a polymerization activating group.

In a seventh aspect of the present invention, a method of producing the above photosensitive composition for optical waveguides comprising the steps of: heating a silicone oligomer and a crosslinking agent in the presence of a solid catalyst; and filtering the solid catalyst, concentrating filtrate, and further adding a polymerization initiator. With this method, initiation of optical crosslinking is remarkably improved.

In an eighth aspect of the present invention, a method of forming a polymer optical waveguide pattern, comprising the steps of: applying and drying the above photosensitive composition for optical waveguides; irradiating said resultant photosensitive composition thin film for optical waveguides with light through a mask; and directly forming a core-ridge pattern by wet etching said photosensitive composition thin film. With this method, a waveguide ridge pattern having a sharp and smooth wall surface can be simply formed without using dry etching or the like.

The inventors have found that these reactive oligomers have a simple pattern formability and are capable of forming a polymer optical waveguide pattern which has superior heat stability and moisture resistance, small birefringence and is easy to connect to optical components, and accomplished the present invention.

Specifically, the present invention is capable of forming a waveguide ridge pattern having a sharp and smooth wall surface by curing a film by irradiation with light and developing by an appropriate solvent. Further, although it has been very difficult to perform waveguide processing in a thick film polymer with material in prior art, the present invention can easily process the waveguide even with a thick film. Still further, with the present invention, birefringence of the photocured of liquid oligomer is reduced to less then $1 \times 10^{-3}$, and polarization dependence can be reduced to less than the tolerance limit. Yet further, by controlling the molecular weight of the polymer optical material, an appropriate viscosity suitable for the thin film formation process can be obtained.

The above and other objects, effects, features and advantages of the present invention will become more apparent from the following description of embodiments thereof taken in conjunction with the accompanying drawings.

DETAILED DESCRIPTION OF THE INVENTION

Figure 1A:
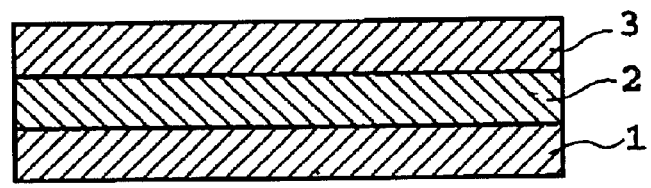
FIG. 1A is a sectional view illustrating a process for producing the polymer optical waveguide according to the present invention, showing a state in which a lower clad layer and a core layer successively laminated on a substrate.

The present invention which solves the problems described above in the prior art is to provide silicone resin, epoxy resin, and acrylic resin with photocurability without deteriorating transparency, heat stability and optical isotropy characteristic of such resins which are capable of directly forming a core-ridge.

In the present invention, a photosensitive substance is formed in layer on a substrate or a clad layer. This photosensitive substance contains a reactive oligomer and a photopolymerization initiator and may further contain a crosslinking agent.

The reactive oligomer used in the present invention is an epoxy-type oligomer, silicone-type oligomer or an acrylic-type oligomer. Specifically, the oligomer is a compound represented by one of above formulae (1) to (6), and these oligomers may be mixed.

Advantages that the photosensitive substance used in the present invention is a reactive oligomer are:
1) Because the state of the polymer material before curing can be made very homogeneous, it has superior optical transmission characteristic in the ultraviolet region or visible region, and has a sufficient resolution even when the film formed by curing is thick,
2) Because the state of the polymer material before curing is an oligomer, leveling is possible even when the substrate or the like has irregular parts, and since the oligomer penetrates into every part, film formation suitable for various shapes is possible,
3) Because the oligomer is randomly connected and cured, the cured material is small in birefringence.

Polymerization of the epoxy oligomer used in the present invention is performed by bonding and crosslinking by UV-irradiation between epoxy or alkoxy group and hydroxy group contained in the epoxy oligomer. In order to effect the crosslinking reaction efficiently and sufficiently, it is desirable to add a photopolymerization initiator. When the photosensitive substance contains a crosslinking agent, polymerization may be performed by bonding and crosslinking by UV-irradiation between epoxy or alkoxy group and hydroxy group contained in the crosslinking agent and epoxy oligomer material.

A silicone oligomer inherently has a property to proceed crosslinking in the presence of a cationic photopolymerization initiator which is so-called a acid generator. Therefore, optical crosslinking is possible in principle under a specific condition even with a combination of only a silicone oligomer and a cationic photopolymerization initiator.

However, according to intensive studies conducted by the inventors, it is very rare that sufficient crosslinking is actually achieved by a combination of only a silicone oligomer and a cationic photopolymerization initiator. In addition, the higher the molecular weight of the oligomer, the more crosslinking tends to proceed, however repeatability is poor and the effect is insufficient. Furthermore, this method can not be a general-purpose technique since an increase in molecular weight of the material itself is difficult when composition of substituent is rich in aromatic groups.

Next, the inventors have attempted a method in which a cationic photopolymerization initiator is added to silicone oligomer to form a film on a substrate, then the film is heat-treated to increase the molecular weight, and then the film is irradiated with light to cure. Sufficient crosslinking is rarely achieved depending on the type of silicone oligomer and heating condition, however, in most cases, crosslinking is insufficient and there are problems in repeatability as in the above-described cases.

Finally, the inventors have found that desired photocurability can be achieved by a method in which a crosslinking agent with a remarkable function as a polymerization coinitiator is added as a third component in addition to silicone oligomer and a cationic photopolymerization initiator. Addition of a silane coupling agent (crosslinking agent) to the photosensitive composition may be used, for example, for the purpose of increasing adhesiveness when the photosensitive composition is cured. This is to achieve close adhesion between the cured material and a material contacting the cured material by containing a crosslinking agent in the photo-cured composition to produce siloxane between both the materials. Therefore, such purpose is substantially different from the use as the polymerization coinitiator in the present invention. In the present invention, attention is given to the fact that the photosensitive composition for optical waveguides includes mainly a silicone oligomer. The crosslinking agent is added for the purpose that the agent selectively reacts with the silicone oligomer by irradiation with light in the presence of an acid generator to effectively progress an increase in molecular weight in the initial stage of photopolymerization. Further, addition of a polymerization coinitiator in the present invention has an effect for enhancing plasticity of the entire composition and promoting progress of polymerization reaction under irradiation.

This method is found to provide sufficient crosslinking as compared with the above-described molecular weight control method or pre-baking method without being affected by the structure of silicone oligomer, high in repeatability, and can be widely applied to photo-crosslinking of silicone oligomer. Crosslinking agents particularly effective as polymerization coinitiators can include the compounds represented by a general formula (7). More specifically, γ-glycidoxypropyl-triethoxysilane represented by structural formula (8), 1,2-bis (triethoxysilyl) ethane, 1,4-bis (triethoxysilyl) benzene, 1,6-bis(triethoxysilyl) ethanehexane, and bi-functional epoxy compounds represented by formulae (9), (10), (11) and (12) and the like can be exemplified.

$$A-R-A' \tag{7}$$

in the above formula, A and A' are independently selected by one of the following three types of structure.

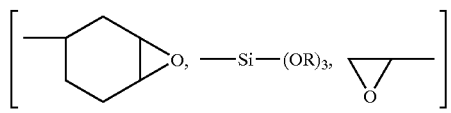

(8)

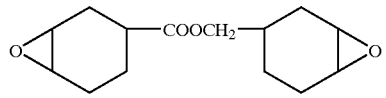

(9)

(10)

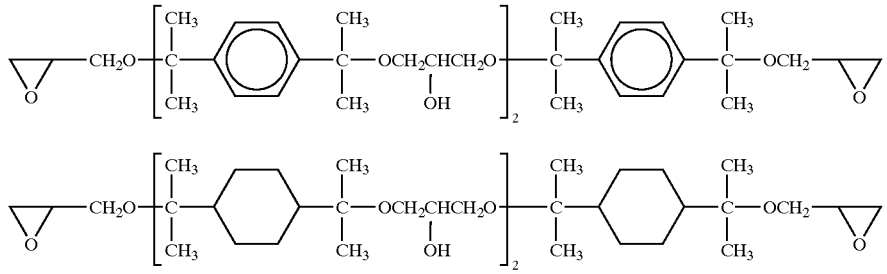

(11)

(12)

In addition to the above, typical crosslinking agents effective as polymerization coinitiators for silicone oligomer are those which undergo ring opening or dehydration condensation by proton supply from the cationic photopolymerization initiator such as epoxy compounds, silane coupling agent, silanol compounds, and alkoxy compounds, including alicyclic epoxy of bifunctional or more other than the above-described ones, (3-glycidoxypropyl) trimethoxysilane, (3-glycidoxypropyl) methyldiethoxysilane, and diphenylsilanediol. Examples of other silane coupling agents can include aminopropyltriethoxysilane, tridecafluoro-1,1,2,2,-tetrahydro-octyltriethoxysilane, N-β-(aminoethyl)-γ-aminopropyltrimethoxysilane, N-β-(aminoethyl)-γ-aminopropyltriethoxysilane, N-bis [β-(aminoethyl)]-γ-aminopropylmethyldimethoxysilane, γ-mercaptopropyltrimethoxysilane, γ-mercaptopropyltrimethoxysilane, γ-methacryloxypropyltrimethoxysilane, N-β-(N-vinylbenzylaminoethyl)-γ-aminopropyltrimethoxysilane hydrochloride, methyltrimethoxysilane, methyltriethoxysilane, vinyltriacetoxysilane, γ-chloropropyltrimethoxysilane, hexamethyldisilazane, γ-anilinopropyltrimethoxysilane, vinyltrimethoxysilane, octadecyldimethyl[3-(trimethoxysilyl) propyl] ammonium chloride, γ-chloropropylmethyldimethoxysilane, γ-mercaptopropylmethyldimethoxysilane, methyltrichlorosilane, dimethyldichlorosilane, trimethylchlorosilane, vinyltriethoxysilane, benzyltrimethylsilane, vinyltris(2-methoxyethoxy) silane, γ-methacryloxypropyltris(2-methoxyethoxy) silane, β-(3,4-epoxycyclohexyl) ethyltrimethoxysilane, γ-ureidopropyltriethoxysilane, γ-isocyanurpropyltriethoxysilane, n-octyltriethoxysilane and the like.

In the present invention, polymerization of the silicone oligomer material includes polymerization by a reaction of a crosslinking agent with the silicone oligomer. Typical crosslinking agents used here can include azide compounds such as azidepyrene, bisazide compounds such as 4,4'-diazidebenzalacetone, 2,6-di-(4'-azidebenzal) cyclohexanone, 2,6-di-(4'-azidebenzal)-4-methylcyclohexanone, diazo compounds and the like.

Polymerization of acrylic oligomer is performed by a reaction of the crosslinking agent with the acrylicoligomer. As the crosslinking agent used here, carbonyl compounds such as diphenyltriketonebenzoin, benzoinmethylether, benzophenone, acetophenone, and diacetyl; peroxides such as benzoyl peroxide; azo compounds such as asobisisobutyronitrile; azide compounds such as azidepyrene; bisazide compounds such as 4,4'-diazidebenzalacetone, 2,6-di-(4'-azidebenzal) cyclohexanone, 2,6-di-(4'-azidebenzal)-4-methylcyclohexanone, and diazo compounds are exemplified as typical ones.

The photopolymerization initiator used in the present invention is not specifically limited if it is generally used as a photopolymerization initiator, and typical cationic photopolymerization initiators include sulfonium salt, osmium salt, antimonium salt and the like. Specifically, preferred cationic photopolymerization initiators include but are not limited to N-benzyl-4-benzoylpyridinium hexafluoroantimonate, N-(3-methyl-2-butenyl)-2-cyanopyridinium hexafluorophosphate, p-chlorobenzenediazonium hexafluorophosphate, diphenyliodonium hexafluorophosphate, and tris(ethylacetoacetato)aluminum. The amount of the crosslinking agent to be added is as small as 1 to 2% and not more than several %.

The optical waveguides produced using the photosensitive composition according to the present invention can be released from the near infrared absorption effect inherent to the crosslinking agent, and maintains the characteristic of optical propagation loss, as is, in the communication wavelength band intrinsic of silicone resin.

Normally, to provide silicone oligomer with photocurability, epoxy or vinyl ether or acrylic group is introduced into the silicone oligomer itself by covalent bond. However, the amount of crosslinking agent used in this case is converted to the amount more than about 50 times as large as the present invention. Thus, the bond between side chains by crosslinking is dominant rather than the strong siloxane bond, which generates not only problems such as heat stability but also an inevitable increase in optical propagation loss due to increase in proportion of hydroxy group in the case of epoxy and increase in proportion of hydrocarbon in the case of vinyl ether or acrylic. That is, formation of a core-ridge directly by light without deteriorating the heat stability and low-loss characteristic in communication-wavelength band specific to silicone resin is possible for the first time using the photosensitive composition for optical waveguides according to the present invention.

A method for producing an optical waveguide using a reactive oligomer material according to the present invention will be described with reference to FIGS. 1A to 1D. FIGS. 1A to 1D are schematic sectional views illustrating processes of forming an optical waveguide according to the present invention.

In the present invention, the reactive oligomer is coated on a substrate or a clad, after position registration, the coating is irradiated with UV light through a mask or directly, and an unirradiated portion is dissolved away with a solvent to form a waveguide ridge pattern.

Figure 1B:
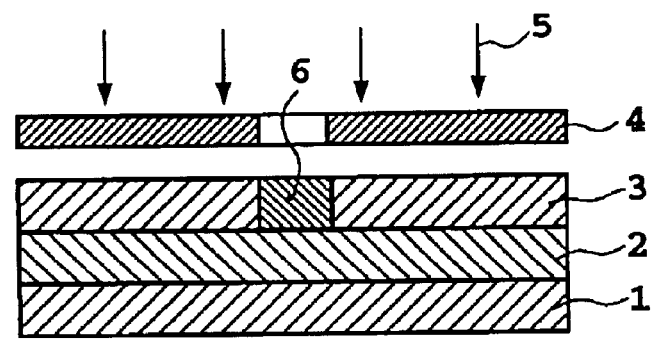
FIG. 1B is a sectional view illustrating a process for producing the polymer optical waveguide according to the present invention, showing a state in which curing light is irradiated through a mask provided on the laminate.
Figure 1C:
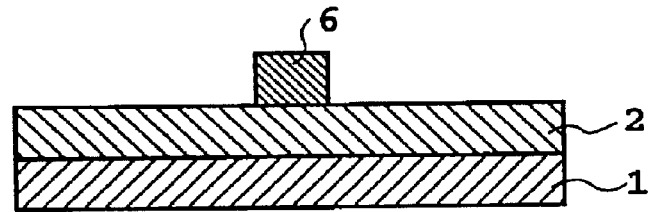
FIG. 1C is a sectional view illustrating a process for producing the polymer optical waveguide according to the present invention, showing a state in which an unirradiated is removed.
Figure 1D:
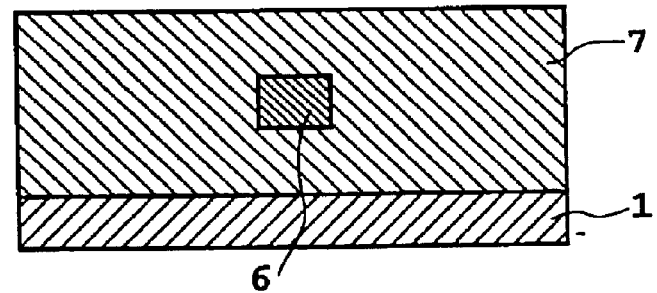
FIG. 1D is a sectional view illustrating a process for producing the polymer optical waveguide according to the present invention, showing a state in which an optical waveguide is completed by covering the core part formed in FIG. 1C to form a clad.

Specifically, as shown in FIG. 1A, a lower clad forming resin layer 2 is formed on a substrate 1, and a core part forming photosensitive substance layer 3 is formed thereon. Next, as shown in FIG. 1B, a mask 4 having a pattern of core part shape is placed on the photosensitive substance layer 3, and irradiated with UV light 5 through the mask 4. This cures only the core part 6 of the photosensitive substance layer 3. After that, a UV light unirradiated portion of the photosensitive substance layer 3, is dissolved out to form a ridge pattern of the core part 6 as shown in FIG. 1C. The same photosensitive resin as the clad part forming resin layer 2 is coated so that the core part 6 is buried thereby forming a clad part 7 as shown in FIG. 1D. The thus produced optical waveguide has superior solvent resistance, is small in polarization dependence because the material used is small in birefringence, low in propagation loss, and has superior heat stability and moisture resistance.

EXAMPLES

The present invention will be described in further detail with reference to examples, however, the present invention is not limited to these examples.

Example 1

Phenyltrichlorosilane (211.5 g) and methyltrichlorosilane (36.3 g) were dissolved in 1 liter of anhydrous tetrahydrofuran, and 3 equivalents of water (67.5 g) was slowly added dropwise to the solution so that the liquid temperature does not increase. After that, 315 g of sodium hydrogencarbonate was added while agitating the reaction liquid. After the completion of carbon dioxide gas evolution, agitation was continued for further 1 hour. Next, the reaction liquid was filtered, then tetrahydrofuran was distilled out by a rotary evaporator to give a colorless, transparent viscous liquid. Further, this liquid was vacuum dried to give an oligomer A. The molecular weight of resulting oligomer A was measured by GPC and the result was Mw==3300, Mn=1500.

Next, a photosensitive substance A was prepared which comprises 50 g of oligomer A, 25 g of UV resin, 2 weight % of N-benzyl-4-benzoylpyridinium hexafluoroantimonate as a photopolymerization initiator and 25 g of methylisobutylketone as a solvent. An optical waveguide using the photosensitive substance A in the core, and an ultraviolet curable resin (UV resin) in the clad was produced as shown in FIGS. 1A to 1D. First, the UV resin was applied to a silicon substrate by a spin coating method to form a layer. At this moment, the rotational speed of the spin coater was adjusted so that the film thickness is 15 $\mu$m. The formed layer was irradiated with UV light of 7000 mJ/cm$^2$, and then heated at 90° C. for 30 minutes to form a lower clad layer 2. Next, the photosensitive substance A was applied by the spin coating method to form a core part formation layer. In this case, the rotational speed of the spin coater was adjusted so that the film thickness is 8 $\mu$m. At this moment, no intermixing was noted between the lower clad layer and the core part formation layer. The formed core part formation layer was heated at 120° C. for 10 minutes to remove the solvent. A mask 4 having a core part pattern to provide a core width of 8 $\mu$m was placed on the core part formation layer, and UV light of 7000 mJ/cm$^2$ was irradiated through the mask. After that, the core part 6 was patterned by heating at 120° C. for 2 minutes. Next, development was performed using a 1:1 mixed solvent of methylisobutylketone and isoproylalcohol to remove a UV light unirradiated portion. The developed layer was heated at 120° C. for 30 minutes to form a core ridge. The same UV resin used for the lower clad was applied onto it and then photocured as the lower clad to produce a buried type channel optical waveguide as shown in FIG. 1, which has a structure with the core part 6 buried in the clad part 7. In this case, the thickness of the upper clad is 8 $\mu$m from the upper surface of the core.

The resulting optical waveguide was cut to a length of 5 cm by a dicing saw, and measured for propagation loss which showed 1.0 dB/cm at wavelength 1.3 $\mu$m, and 1.2 dB/cm or less at wavelength 0.633 $\mu$m. Further, this optical propagation loss of the waveguide was unchanged for more than 1 month under the condition of 75° C./90% RH.

Example 2

A photosensitive substance B was prepared which comprises 50 g of the oligomer A produced in Example 1, 1 g of (3-glycidoxypropyl) trimethoxysilane as a crosslinking agent, 2 weight % of N-benzyl-4-benzoylpyridinium hexafluoroantimonate as a photopolymerization initiator, and 25 g of methylisobutylketone as a solvent.

Using the same procedure as in Example 1 except that the photosensitive substance B was used in place of the photosensitive substance A as a core part forming photosensitive substance, a buried type channel optical waveguide comprising a core-clad layer structure as shown in FIG. 1D was produced. In this case, the thickness of the upper clad is 8 $\mu$m from the upper surface of the core. Further, no intermixing was noted between the lower clad layer and the core part formation layer.

As in Example 1, the resulting optical waveguide was cut to a length of 5 cm by a dicing saw, and measured for optical propagation loss which showed 0.5 dB/cm at wavelength 1.3 $\mu$m, and 0.8 dB/cm or less at wavelength 1.55 $\mu$m. Further, this optical propagation loss of the waveguide was unchanged for more than 1 month under the condition of 75° C./90% RH.

Example 3

Oligomer B was produced using the same procedure as in Example 1 except that deuterated phenyltrichlorosilane was used in place of phenyltrichlorosilane in the production of oligomer A in Example 1, and a photosensitive substance C was produced using the same procedure as in Example 2 except that oligomer B was used in place of oligomer A. Next, a buried type channel optical waveguide of core diameter 8 $\mu$m×8 $\mu$m was produced by the same process as in Example 2.

The resulting optical waveguide was cut to a length of 5 cm by a dicing saw, and measured for optical propagation loss which showed 0.1 dB/cm at wavelength 1.3 $\mu$m, and 0.5 dB/cm or less at wavelength 1.55 $\mu$m. Further, this optical propagation loss of the waveguide was unchanged for more than 1 month under the condition of 75° C./90% RH.

Examples 4 to 11

Using quite the same procedure as in Example 3, eight types of optical waveguide differing in compositional ratio of silicone oligomer side chain of the core, crosslinking agent and initiator were produced. The respective optical waveguides were measured for optical propagation loss, and the results of measurement are shown in Table 1 comparing with the results of Example 1 to 3.

the layer was irradiated with UV light through a mask having a waveguide pattern of core part shape. In this case, irradiation amount of UV light was 2000 mJ/cm$^2$. When the layer was developed by an isopropanol solution, a UV light unirradiated portion of the photosensitive substance layer

TABLE 1 optical propagation loss of respective waveguides

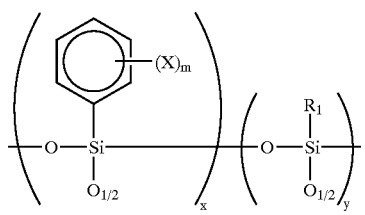

(1)

| Example | Structure of silicone oligomer(1) used in core | cross-linking agent | polymerization initiator | loss (dB/cm) |
|---|---|---|---|---|
| 1 | X = H, R$_1$ = CH$_3$<br>x = 0.5, y = 0.5 | Nil | N-benzyl-4-benzoylpyridinium hexafluoro antimonate (13) | 1.0(at 1.31 μm) |
| 2 | X = H, R$_1$ = CH$_3$<br>x = 0.95, y = 0.05 | (8) | (13) | 0.5(at 1.3 μm)<br>0.8(at 1.55 μm) |
| 3 | X = D, R$_1$ = CH$_3$,<br>x = 0.95, y = 0.05 | (8) | (13) | 0.1(at 1.31 μm)<br>0.5(at 1.55 μm) |
| 4 | X = D, R$_1$ = CH$_3$,<br>x = 0.5, y = 0.5 | (8) | (13) | 0.2(at 1.31 μm)<br>1.0(at 1.55 μm) |
| 5 | X = D, R$_1$ = CH$_3$,<br>x = 0.3, y = 0.7 | (8) | (13) | 0.3(at 1.31 μm)<br>1.2(at 1.55 μm) |
| 6 | X = D, R$_1$ = CH$_3$,<br>x = 0.95, y = 0.05 | (9) | N-(3-methyl-2-butenyl)-2-cyanopyridinium hexafluorophosphate (14) | 0.1(at 1.31 μm)<br>0.5(at 1.55 μm) |
| 7 | X = D, R$_1$ = CH$_3$,<br>x = 0.5, y = 0.5 | (9) | (14) | 0.2(at 1.31 μm)<br>1.0(at 1.55 μm) |
| 8 | X = D, R$_1$ = CH$_3$,<br>x = 0.3, y = 0.7 | (9) | (14) | 0.3(at 1.31 μm)<br>1.2(at 1.55 μm) |
| 9 | X = H, R$_1$ = CH$_3$,<br>x = 0.95, y = 0.05 | (10) | p-chlorobenzene diazonium hexafluorophosphate | 0.3(at 1.31 μm)<br>1.0(at 1.55 μm) |
| 10 | X = Cl, R$_1$ = C$_2$H$_5$,<br>x = 0.95, y = 0.05 | (11) | diphenyliodonium hexafluorophosphate | 0.3(at 1.31 μm)<br>0.8(at 1.55 μm) |
| 11 | X = OCH$_3$, R$_1$ = C$_3$H$_7$,<br>x = 0.95, y = 0.05 | (12) | tris(ethylacetoaceta to)aluminum | 0.5(at 1.31 μm)<br>1.5(at 1.55 μm) |

Example 12

A photosensitive substance D was prepared from 100 weight % of liquid oligomer having the following structural formula (15) (where z=0 to 2) and 2 weight % of N-benzyl-4-benzoylpyridinium hexafluoroantimonate as a photopolymerization initiator.

was dissolved, and only a UV light irradiated portion of the cured liquid epoxy oligomer was remained to form a ridge pattern of core part shape. The refractive index of the core part after curing was 1.525 at wavelength 1.55 μm. After that, this ridge pattern was coated with an epoxy resin adjusted to provide a refractive index at photocuring of 1.52 at wavelength 1.55 μm, and cured to produce an optical

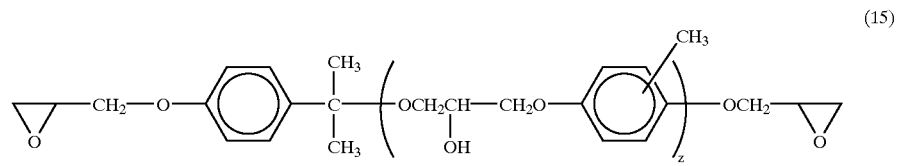

(15)

Epoxy resin having a thickness of 100 μm was formed on a substrate. This epoxy resin had a refractive index of 1.52 at wavelength 1.55 μm. Next, the photosensitive substance D was applied to the epoxy resin layer by spin coating method to form a photosensitive substance layer. After that, waveguide where the core is buried in the clad as shown in FIG. 1D. Thus, a single mode channel waveguide (core diameter 8 μm×8 μm, Δn=0.3%) having a clad comprising epoxy resin of refractive index 1.52 and a core comprising UV-cured epoxy resin of refractive index 1.525 was produced.

The resulting optical waveguide was cut to a length of 5 cm by a dicing saw, and measured for optical propagation loss which was 1.5 dB or less at wavelength 1.3 μm, and 3.0 dB or less at wavelength 1.55 μm. Polarization dependence of the optical propagation loss was 0.1 dB or less at both wavelength 1.3 μm and 1.55 μm. Further, the resulting optical propagation loss of the waveguide was unchanged for more than 1 month under the condition of 75° C./90% RH.

Example 13

A single mode channel waveguide (core diameter 8 μm ×8 μm, Δn=0.3%) was produced using the same procedure as in Example 12 except that a photosensitive substance E prepared from 100 weight % of liquid silicone epoxy oligomer (desirably having a molecular weight of 1000 to 10000) represented by the following structural formula (16) and 2 weight % of N-benzyl-4-benzoylpyridinium hexafluoroantimonate as a photopolymerization initiator was used in place of the photosensitive substance D.

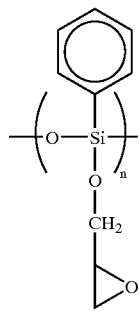

(16)

The resulting optical waveguide was cut to a length of 5 cm by a dicing saw, and measured for optical propagation loss which showed 1.0 dB or less at wavelength 1.3 μm, and 1.5 dB or less at wavelength 1.55 μm. Polarization dependence of the optical propagation loss was 0.1 dB or less at wavelength both 1.3 μm and 1.55 μm. Further, the optical propagation loss of the waveguide was unchanged for more than 1 month under the condition of 75° C./90% RH.

Example 14

A single mode channel waveguide (core diameter 8 μm ×8 μm, Δn=0.3%) was produced using the same procedure as in Example 12 except that a photosensitive substance F prepared from 100 weight % of liquid silicone oligomer represented by the following structural formula (17) and 2 weight % of N-benzyl-4-benzoylpyridinium hexafluoroantimonate as a photopolymerization initiator was used in place of the photosensitive substance D.

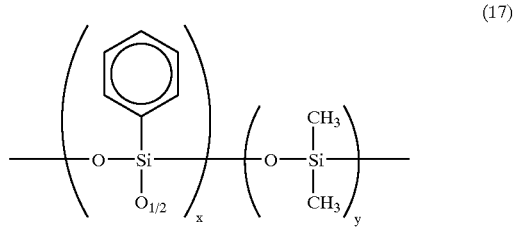

(17)

The resulting optical waveguide was cut to a length of 5 cm by a dicing saw, and measured for optical propagation loss which was 1.5 dB or less at wavelength 1.3 μm, and 3.0 dB or less at wavelength 1.55 μm. Polarization dependence of the optical propagation loss was 0.1 dB or less at wavelength both 1.3 μm and 1.55 μm. Further, the optical propagation loss of the waveguide was unchanged for more than 1 month under the condition of 75° C./90% RH.

Next, a multi-mode optical waveguide (depth 40 μm, width 40 μm, Δn=1%) was produced using the same procedure as in Example 1 except that the above photosensitive substance F was used in place of the photosensitive substance A. This optical waveguide was cut to a length of 5 cm by a dicing saw, and measured for optical propagation loss which was 1.0 dB or less at wavelength 0.85 μm, 0.5 dB or less at wavelength 1.3 μm and 1.0 dB or less at wavelength 1.55 μm. Polarization dependence of the optical propagation loss was less 0.1 dB or less. Further, the optical propagation loss of the waveguide was unchanged for more than 1 month under the condition of 75° C./90% RH.

Examples 15 to 23

Using quite the same procedure as in Example 14, nine types of optical waveguide differing in compositional ratio of silicone oligomer side chain of the core, crosslinking agent and initiator were produced. The respective optical waveguides were measured for optical propagation loss, and the results of measurement are shown in Table 2.

TABLE 2

Loss of optical propagation in respective waveguides (17)

| Example | Structure of silicone oligomer(17) used in core | cross- linking agent | polymerization initiator | lost (dB/cm) |
|---|---|---|---|---|
| 15 | x = 0.95, y = 0.05 | (8) | N-benzyl-4-benzoylpyridinium hexafluoro antimonate (13) | 0.2(at 1.31 μm) 0.6(at 1.55 μm) |

TABLE 2-continued

Loss of optical propagation in respective waveguides

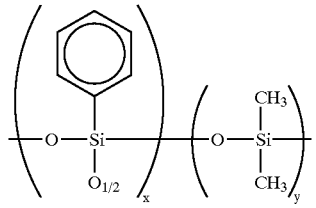
(17)

| Example | Structure of silicone oligomer(17) used in core | cross-linking agent | polymerization initiator | lost (dB/cm) |
|---|---|---|---|---|
| 16 | x = 0.5, y = 0.5 | (8) | (13) | 0.3(at 1.31 μm) 1.2(at 1.55 μm) |
| 17 | x = 0.3, y = 0.7 | (8) | (13) | 0.4(at 1.31 μm) 1.5(at 1.55 μm) |
| 18 | x = 0.95, y = 0.05 | (9) | N-(3-methyl-2-butenyl)-2-cyano-pyridinium hexafluorophosphate (14) | 0.2(at 1.31 μm) 0.6(at 1.55 μm) |
| 19 | x = 0.5, y = 0.5 | (9) | (14) | 0.3(at 1.31 μm) 1.2(at 1.55 μm) |
| 20 | x = 0.3, y = 0.7 | (9) | (14) | 0.4(at 1.31 μm) 1.5(at 1.55 μm) |
| 21 | x = 0.5, y = 0.5 | (10) | p-chlorobenzene diazonium hexafluorophosphate | 0.3(at 1.31 μm) 1.2(at 1.55 μm) |
| 22 | x = 0.5, y = 0.5 | (11) | diphenyliodonium hexafluorophosphate | 0.3(at 1.31 μm) 1.2(at 1.55 μm) |
| 23 | x = 0.5, y = 0.5 | (12) | tris(ethylaceto acetato) aluminum | 0.5(at 1.31 μm) 1.2(at 1.55 μm) |

Example 24

A single mode channel waveguide (core diameter 8 μm ×8 μm, Δn=0.3%) was produced using the same procedure as in Example 12 except that a photosensitive substance G prepared from 100 weight % of liquid silicone vinylether oligomer represented by the following structural formula (18) and 2 weight % of 2,6-di(4'-azidebenzal)-4-methylcyclohexanone as a photopolymerization initiator was used in place of the photosensitive substance D.

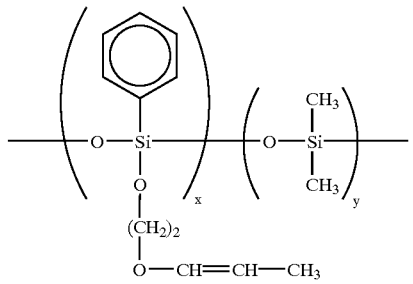
(18)

The resulting optical waveguide was cut to a length of 5 cm by a dicing saw, and measured for optical propagation loss which was 1.5 dB or less at wavelength 1.3 μm, and 3.0 dB or less at wavelength 1.55 μm. Polarization dependence of the optical propagation loss was 0.1 dB or less. Further, the optical propagation loss of the waveguide was unchanged for more than 1 month under the condition of 75° C./90% RH.

Example 25

A single mode channel waveguide (core diameter 8 μm ×8 μm, Δn=0.3%) was produced using the same procedure as in Example 12 except that a photosensitive substance H prepared from 100 weight % of liquid acrylic oligomer represented by the following structural formula (19) and 2 weight % of diphenyltriketonebenzoin as a photopolymerization initiator was used in place of the photosensitive substance D.

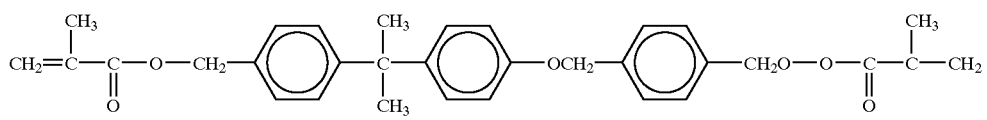
(19)

The resulting optical waveguide was cut to a length of 5 cm by a dicing saw and measured for optical propagation loss which was 0.5 dB or less at wavelength 1.3 μm, and 5.0 dB or less at wavelength 1.55 μm. Polarization dependence of the optical propagation loss was 0.1 dB or less at wavelength both 1.3 μm and 1.55 μm. Further, the optical propagation loss of the waveguide was unchanged for more than 1 month under the condition of 75° C./90% RH.

Example 26

240 g of Phenyltriethoxysilane, 20 g of methyltriethoxysilane, 10 g of water, 100 g of isopropylalcohol, and 0.1 g of hydrochloric acid were mixed, heated under reflux for 4 hours. Then solvents and the like were removed under vacuum using a rotary evaporator to give 112 g of colorless, transparent oligomer C. 50 g of the oligomer C, 1 g of 3glycidoxypropyltriethoxysilane, 7 g of water, 20 g of isopropylalcohol, 2 g of ion-exchange resin (AMBERLITE IRA900 from Aldrich Co.) were charged into a reaction vessel, heated at 80° C. for 12 hours while agitating. The ion exchange resin was removed by filtration, and then isopropylalcohol was removed under vacuum using a rotary evaporator to give 44 g of a colorless, transparent oily substance D.

Next, using the same procedure as above except that 253 g of phenyltriethoxysilane and 6 g of methyltriethoxysilane were used, 110 g of colorless, transparent oligomer E was obtained, which gave 40 g of a colorless, transparent oily substance F.

Using these oily substances D and F, an optical waveguide was produced according to the conventional photolithographic technique using the following procedure. First, the oily substance D was mixed with a cationic photopolymeization initiator to give a photosensitive composition G for optical waveguides which was applied onto a silicon wafer by a spin coating method. In this case, the rotational speed of the spin coater was adjusted so that the film thickness is about 15 μm. The formed film was photocured by irradiation of UV light for 10 minutes, and thoroughly cured at 150° C. to form a lower clad layer. Next, the oily substance F was mixed with a cationic photopolymerization initiator to give a photosensitive composition H for optical waveguides, which was applied to the above-mentioned lower clad layer, and irradiated with UV light for 10 minutes through an 8 μm wide linear mask. An uncured portion was washed out by a solvent, and thoroughly cured at 150° C. to form a rectangular core of 8 μm in width and 8 μm in height. An upper clad was formed on it using the same procedure as the lower clad to give a buried optical waveguide. The waveguide was measured for optical propagation loss at 1.55 μm band which was confirmed to be less than 0.5 dB/cm.

Examples 27 to 30

The oligomers shown in Table 3 were used in place of oligomer E, respectively treated with ion-exchange resin as in Example 26 to prepare photosensitive substances mixed with photopolymerization initiator. Further, a buried channel optical waveguide having core-clad layer structure as shown in FIG. 1D was produced using the same procedure as in Example 1 except that the above treated photosensitive substance was used in place of the photosensitive substance A as the core part forming photosensitive substance. In this case, the thickness of the upper clad was controlled to 8 μm. No intermixing was noted between the lower clad layer and the core part formation layer. The results of optical propagation loss measurement are shown in Table 3.

TABLE 3

Loss of optical propagation in respective waveguides

| Example | Structure of silicone oligomer used in core | polymerization initiator | loss (dB/cm) |
| --- | --- | --- | --- |
| 27 | (15) | N-benzyl-4-benzoyl-pyridinium hexafluoro antimonate (13) | 1.5 (at 1.31 μm) 3.0 (at 1.55 μm) |
| 28 | (16) | (13) | 1.0 (at 1.31 μm) 1.5 (at 1.55 μm) |
| 29 | (17) | (13) | 1.5 (at 1.31 μm) 3.0 (at 1.55 μm) |
| 30 | (19) | (13) | 0.5 (at 1.31 μm) 5.0 (at 1.55 μm) |

The present invention has been described in detail with respect to preferred embodiments, and it will now be apparent that changes and modifications may be made without departing from the invention in its broader aspects, and it is the intention, therefore, in the appended claims to cover all such changes and modifications as fall within the true spirit of the invention.

What is claimed is:

1. A method of forming a polymer optical waveguide pattern, comprising the steps of:
    applying and drying a photosensitive composition for optical waveguides;
    irradiating said resultant photosensitive composition thin film for optical waveguides with light through a mask; and
    directly forming a core-ridge pattern by wet etching said photosensitive composition thin film;
    wherein the photosensitive composition comprises
        an organic oligomer, said organic oligomer being a silicone oligomer represented by the following formula (1):

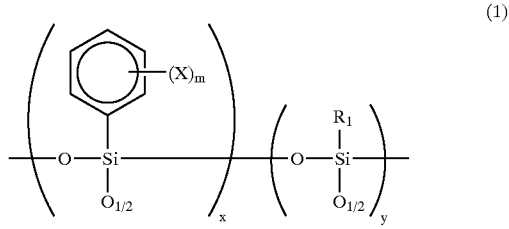

(1)

wherein X denotes hydrogen, deuterium, halogen, an alkyl group or an alkoxy group; m is an integer from 1 to 5; x and y designate the proportion of respective units, and neither x nor y is 0; and $R_1$ denotes a methyl, ethyl, or isopropyl group;
        a polymerization initiator which is an acid generator; and
        a crosslinking agent which is a separate, independent compound from said silicone oligomer.

2. A method of forming a polymer optical waveguide pattern as claimed in claim 1, wherein said photosensitive composition for optical waveguides is cationic photopolymerizable, and said crosslinking agent is capable of greatly activating photopolymerizability of said silicone oligomer as a main component of said composition.

3. A method of forming a polymer optical waveguide pattern as claimed in claim 1, wherein said crosslinking agent has at least an epoxy moiety or an alkoxysilane moiety in the molecule.

4. A method of forming a polymer optical waveguide pattern as claimed in claim 1, wherein said crosslinking agent is at least one compound selected from the group consisting of the formulas (8), (9), (10), (11) and (12):

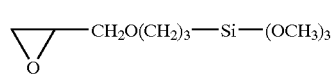 (8)

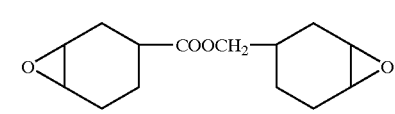 (9)

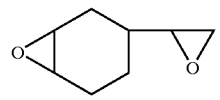 (10)

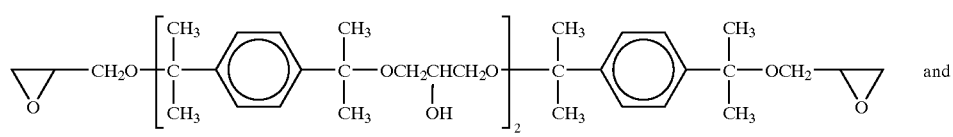 and (11)

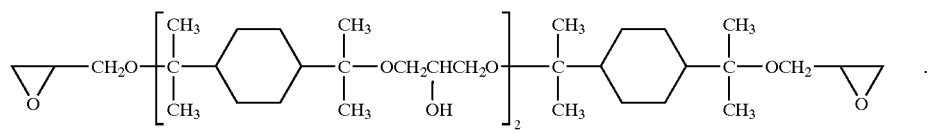 (12)

5. A method of forming a polymer optical waveguide pattern, comprising the steps of:
applying and drying a photosensitive composition for optical waveguides;
irradiating said resultant photosensitive composition thin film for optical waveguides with light through a mask; and
directly forming a core-ridge pattern by wet etching said photosensitive composition thin film;
wherein the photosensitive composition comprises
an organic oligomer, said organic oligomer being a silicone oligomer represented by the following formula (3):

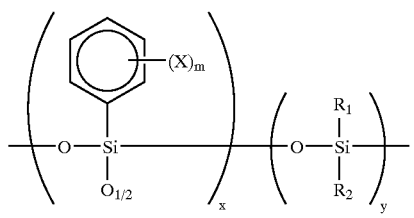 (3)

wherein X denotes hydrogen, deuterium, halogen, an alkyl group or an alkoxy group; m is an integer from 1 to 5; x and y designate the proportion of respective units, and neither x nor y is 0; and $R_1$ and $R_2$ may be the same as or different from each other, and denote a methyl, ethyl, or isopropyl group;
a polymerization initiator which is an acid generator; and a crosslinking agent which is a separate, independent compound from said silicone oligomer.

6. A method of forming a polymer optical waveguide pattern as claimed in claim 5, wherein said photosensitive composition for optical waveguides is cationic photopolymerizable, and said crosslinking agent is capable of greatly activating photopolymerizability of said silicone oligomer as a main component of said composition.

7. A method of forming a polymer optical waveguide pattern as claimed in claim 5, wherein said crosslinking agent has at least an epoxy moiety or an alkoxysilane moiety in the molecule.

8. A method of forming a polymer optical waveguide pattern as claimed in claim 5, wherein said crosslinking agent is at least one compound selected from the group consisting of the formulas (8), (9), (10), (11) and (12):

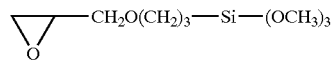 (7)
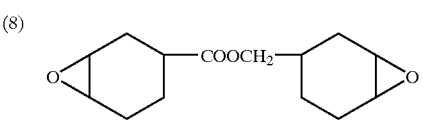 (8)
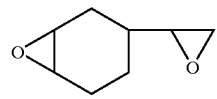 (9)
(10)
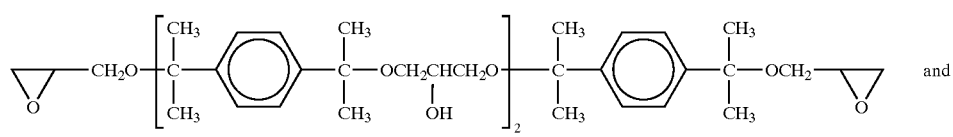 and (11)
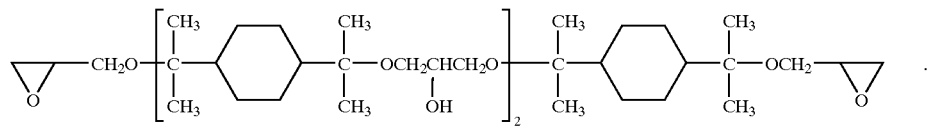 . (12)
\* \* \* \* \*